(12) United States Patent
Koch

(10) Patent No.: US 9,461,485 B2
(45) Date of Patent: Oct. 4, 2016

(54) BATTERY MAGNETIC STATE OF CHARGE SENSOR CONTROL ALGORITHM

(75) Inventor: Brian J. Koch, Berkley, MI (US)

(73) Assignee: GM Global Technology Operations LLC, Detroit, MI (US)

(*) Notice: Subject to any disclaimer, the term of this patent is extended or adjusted under 35 U.S.C. 154(b) by 1336 days.

(21) Appl. No.: 13/313,944

(22) Filed: Dec. 7, 2011

(65) Prior Publication Data
US 2013/0151180 A1  Jun. 13, 2013

(51) Int. Cl.
| | |
|---|---|
| B60L 11/18 | (2006.01) |
| H02J 7/00 | (2006.01) |
| G01R 33/16 | (2006.01) |
| H01M 10/48 | (2006.01) |
| G01R 31/36 | (2006.01) |
| H01M 4/58 | (2010.01) |
| H01M 10/0525 | (2010.01) |

(52) U.S. Cl.
CPC .......... *H02J 7/0021* (2013.01); *B60L 11/1805* (2013.01); *B60L 11/1861* (2013.01); *B60L 11/1877* (2013.01); *G01R 31/3606* (2013.01); *G01R 33/16* (2013.01); *H01M 10/48* (2013.01); *B60L 2240/545* (2013.01); *B60L 2240/549* (2013.01); *H01M 4/5825* (2013.01); *H01M 10/0525* (2013.01); *H02J 2007/005* (2013.01); *Y02T 10/7005* (2013.01); *Y02T 10/705* (2013.01); *Y02T 10/7011* (2013.01); *Y02T 10/7016* (2013.01); *Y02T 10/7044* (2013.01); *Y02T 10/7055* (2013.01)

(58) Field of Classification Search
CPC ........................................................ B60L 11/18
USPC ............................................................ 702/63
See application file for complete search history.

(56) References Cited

U.S. PATENT DOCUMENTS

| | | | |
|---|---|---|---|
| 4,876,513 A * | 10/1989 | Brilmyer | ............. B60L 11/1857 320/136 |
| 6,136,177 A | 10/2000 | Hung | |
| 7,928,690 B2 | 4/2011 | Koch | |
| 2009/0115420 A1 | 5/2009 | Koch | |
| 2010/0079145 A1 | 4/2010 | Meisner | |
| 2011/0119015 A1* | 5/2011 | Hirobe | .................... G01C 17/28 702/104 |
| 2012/0086430 A1* | 4/2012 | Marten | .............. G01R 19/0092 324/76.11 |

* cited by examiner

*Primary Examiner* — Bryan Bui
(74) *Attorney, Agent, or Firm* — John A. Miller; Miller IP Group, PLC

(57) ABSTRACT

A system and method for estimating the state-of-charge (SOC) of a battery cell in a vehicle using a magnetic sensor that measures changes in magnetism of the battery cell. The method provides an offset correction to a current output signal from the magnetic sensor that calibrates the current output signal to a known magnetic field strength, provides a temperature correction to the current output signal that corrects the current output signal based on a temperature of the magnetic sensor, and provides a current correction to the current output signal that removes portions of the magnetic field caused by other battery cells, where the corrected current output signal is converted to the battery cell SOC.

16 Claims, 2 Drawing Sheets

BATTERY MAGNETIC STATE OF CHARGE SENSOR CONTROL ALGORITHM

BACKGROUND OF THE INVENTION

1. Field of the Invention

This invention relates generally to a system and method for estimating a battery state of charge and, more particularly, to a system and method for estimating battery state-of-charge using a magnetic sensor that measures the change in magnetic susceptibility of one or more of the materials in the battery, and providing offset correction, temperature correction and current correction of a current output signal from the magnetic sensor.

2. Discussion of the Related Art

Electric vehicles are becoming more and more prevalent. These vehicles include hybrid vehicles, such as the extended range electric vehicles (EREV), that combine a battery and a main power source, such as an internal combustion engine, fuel cell systems, etc., and electric only vehicles, such as the battery electric vehicles (BEV). All of these types of electric vehicles employ a high voltage battery that includes a number of battery cells. These batteries can be different battery types, such as lithium-ion, nickel metal hydride, lead-acid, etc. A typical high voltage battery system for an electric vehicle may include a large number of battery cells or modules including several battery cells to meet the vehicle power and energy requirements, where each battery module may include a certain number of battery cells, such as twelve cells. The individual battery cells may be electrically coupled in series, or a series of cells may be electrically coupled in parallel, where a number of cells in the module are connected in series and each module is electrically coupled to the other modules in parallel. Different vehicle designs include different battery designs that employ various trade-offs and advantages for a particular application.

In order to maximize battery durability and provide useful range information to a driver of the vehicle, it is important to be able to accurately determine the state-of-charge (SOC) of the battery in an electric or hybrid vehicle. A common method for estimating the SOC of a battery is by measuring the open circuit or no load voltage across the battery. The open circuit voltage measurement is easy to obtain, but unfortunately may be prone to errors. Open circuit voltage error may be introduced by a voltage sensor itself, by a voltage sensing circuit in a controller, by sizing of electronics hardware, ND converters, filter gains, or by combinations of these and other factors.

Certain batteries suitable for electric vehicles, such as nickel metal hydride and some types of lithium ion batteries, produce a nearly constant open circuit voltage across most of the range of the state-of-charge of the battery. Complex models and algorithms may be employed to estimate the open circuit voltage under a load, and very precise measurements of the true open circuit voltage may be acquired when the battery is at rest, but the fact remains that very little information about state-of-charge can be ascertained from voltage in certain regions of operation. A weak dependence of open circuit voltage on state-of-charge can result in erroneous estimations of the remaining battery energy and driving range of the vehicle, and can also lead to over or under-utilization of the battery. However, these types of batteries are usually still highly desirable as power sources for electric hybrid vehicles because of their low mass, high power capability and larger energy storage capacity. Accordingly, for vehicles that employ battery types that have a nearly constant open circuit voltage across most of the range of the battery SOC, it is desirable to provide a system and method for determining the SOC of the battery that is not based on its open circuit voltage.

In one specific lithium ion battery design, the positive terminal plates of the individual cells are comprised of iron phosphate and the negative terminal plates are comprised of graphite, where it is the magnetic properties of the iron phosphate that changes as the cell SOC changes in a linear manner. Specifically, as the SOC of the battery cell increases, the magnetic susceptibility of the iron phosphate decreases. Because of this, it is known in the art to employ magnetic sensors to measure the SOC of these types of battery.

U.S Patent Application Publication No. 2010/0079145, titled System and Method to Determine the State of Charge of a Battery Using Magnetostriction to Detect Magnetic Response of a Battery Material, assigned to the assignee of this application and herein incorporated by reference, discloses a technique for determining battery SOC based on the magnetic response of the battery material. The '145 application discloses a magnetic sensor that is coupled to a battery cell, where the sensor includes a first coil and a second coil. An AC signal is provided to the first coil that induces a magnetic field within the battery cell, which in turn induces a current flow in the second coil. The current flow in the second coil is measured where the magnetic properties of the battery cell change in response to changes in battery SOC.

SUMMARY OF THE INVENTION

In accordance with the teachings of the present invention, a system and method are disclosed for estimating the state-of-charge (SOC) of a battery cell in a vehicle using a magnetic sensor that measures changes in magnetic properties of the battery cell. The method provides an offset correction to a current output signal from the magnetic sensor that calibrates the current output signal to a known magnetic field strength, provides a temperature correction to the current output signal that corrects the current output signal based on a temperature of the magnetic sensor, and provides a current correction to the current output signal that removes portions of the magnetic field caused by other battery cells, where the corrected current output signal is converted to the battery cell SOC. If the battery cell voltage is at a voltage landmark location where the relationship between the battery cell voltage and the battery cell SOC is not flat, then the battery cell voltage is used to determine the battery cell SOC instead of the corrected current output signal. Likewise, if the magnetic field response is at a magnetic landmark location where the relationship between the magnetic field and the battery cell SOC is unique, then the magnetic field is used to determine the battery cell SOC instead of the corrected current output signal.

Additional features of the present invention will become apparent from the following description and appended claims, taken in conjunction with the accompanying drawings.

DETAILED DESCRIPTION OF THE EMBODIMENTS

The following discussion of the embodiments of the invention directed to a system and method for estimating the state-of-charge of a battery using a magnetic sensor is merely exemplary in nature, and is in no way intended to limit the invention or its applications or uses. For example, the discussion herein concerns estimating the state-of-charge of a vehicle battery. However, as well be appreciated by those skilled in the art, the technique for estimating the battery state-of-charge will have other applications.

Figure 1:
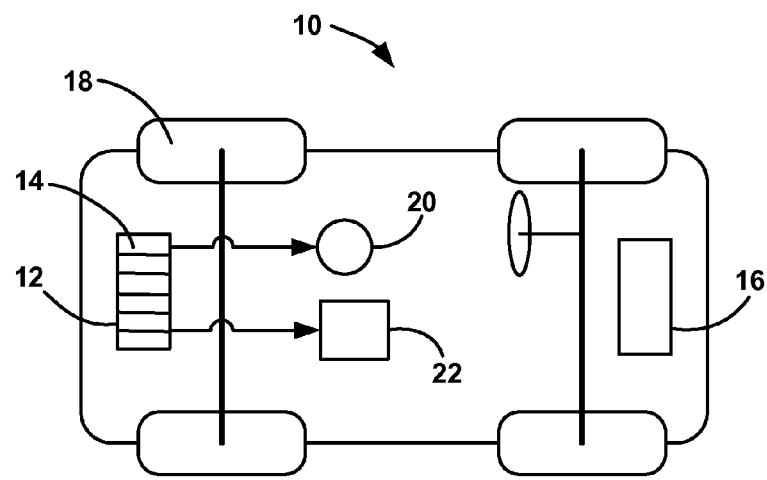
FIG. 1 is a simple illustration of an electric hybrid vehicle.

FIG. 1 is a simple illustration of a vehicle 10 intended to represent any electric vehicle or electric hybrid vehicle. The vehicle 10 may be a pure plug-in electric vehicle, a fuel cell electric vehicle, a gasoline-electric vehicle, a diesel-electric hybrid vehicle, or any other type of vehicle that uses a high voltage battery for some or all of its power. The vehicle 10 includes a high voltage battery 12 or battery pack mounted to a suitable support within the vehicle 10, where the battery 12 includes a plurality of battery cells 14. The battery 12 can be any battery suitable for an electric vehicle, such as a lead-acid battery, lithium-ion battery, metal hydride battery, etc. The battery 12 provides energy to a motor 20, which drives the vehicle's wheels 18. The vehicle 10 may also include a separate power source 16, such as an internal combustion engine, fuel cell system, etc.

Battery open circuit voltage is often used as an indicator of battery SOC, as the open circuit voltage is known to drop as battery state-of-charge drops. Knowing the SOC of the battery 12 is important for proper vehicle energy and power management. In a pure electric vehicle, a low state-of-charge must be communicated to the vehicle's driver, so that the battery 12 can be plugged in and recharged. In a hybrid vehicle, a low state-of-charge will trigger the start-up of the source 16, which can recharge the battery 12. A controller 22 is provided to determine the SOC of the battery 12 consistent with the discussion herein.

In many types of battery chemistries, the relationship between open circuit voltage and state-of-charge is very linear and exhibits little or no slope. As a result, there are some regions of battery state-of-charge where the open circuit voltage is not a good enough indicator of battery state-of-charge. That is because, in these regions, the open circuit voltage remains nearly constant over a fairly wide range of the state-of-charge. In the regions where open circuit voltage is not a good indicator of state-of-charge, it is desirable to use some other measurement to estimate battery state-of-charge. The present invention proposes using a magnetic sensor to determine the battery cell SOC for these battery types. A brief overview of how battery cell SOC for certain types of battery materials produces different magnetic responses is given below.

Magnetic susceptibility describes the extent to which a material becomes magnetized in the presence of an applied magnetic field. The magnetic susceptibility per unit volume of a material Xv is given by the equation:

$$Xv = MH, \quad (1)$$

where M is the magnetization expressed as the magnetic dipole per unit volume and H is the applied magnetic field.

Magnetic susceptibility X may also be expressed per unit mass or per mole of the material. The mechanical force exerted by the applied magnetic field on the material is proportional to the magnetic susceptibility X, to the magnetic field strength, and to the magnetic field gradient. If the susceptibility X is positive, the material is attracted to regions of increasing magnetic field strength and is described as being "paramagnetic." If the susceptibility X is negative, the material is conversely repelled and is described as being "diamagnetic."

The magnetization induced in the material by the action of the applied magnetic field generates its own magnetic field that combines with the applied field. In the case of a paramagnetic material, the combined magnetic field is generally increased over the applied magnetic field alone, where that increase is proportional to the paramagnetic susceptibility of the material. In the case of a diamagnetic material, the resulting combined magnetic field is, conversely, reduced. Both cases can, in principle, be used for the purposes of this invention.

Magnetism may be generated by free-circulating electrical currents, such as those found in electromagnets, or by electron currents observed in the ring structures of some organic molecules. A notable case of the so-called "paramagnetic ring current" arises when alkali metal ions are introduced between the sheets of six-carbon rings comprising graphite. The storage of lithium in graphite forms the basis of a common negative electrode material in lithium ion batteries. More commonly, magnetism in materials arises from both the localized spin of electrons and their orbital motion within atoms. Magnetic susceptibility is observed in free ions of the iron-group series, actinide-series, and rare-earth series elements on the periodic table. Compounds find use as active materials for electrochemical energy storage in batteries. They often belong to a class known as intercalation or insertion compounds, which are characterized by the ability to have small ions, such as lithium, readily inserted into and withdrawn from their solid-state structures. This behavior provides for the charge and discharge processes of the battery.

Common metal oxides for lithium ion batteries that are intercalation materials include lithium cobalt oxide $LiCoO_2$, lithium nickel oxide $LiNiO_2$, and variants of the form $LiCo_xNi_yMn_zO_2$, where the cobalt, nickel, and manganese species occupy the same lattice sites and $x+y+z=1$. Some lithium battery materials form two phases as the undergo intercalation, giving rise to a flat open circuit voltage characteristic wherever the two phases coexist. An example of a two-phase insertion electrode presently being considered for use as a cathode in lithium ion batteries is iron phosphate ($FePO_4$). The relevant electrochemical reaction is given by:

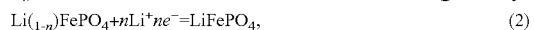
$$Li_{(1-n)}FePO_4 + nLi^+ ne^- = LiFePO_4, \quad (2)$$

where n is the number of lithium ions and electrons involved in the reaction.

During discharge of the battery 12, lithium is inserted into the iron phosphate, and while the battery 12 is being charged, lithium is removed. The fraction of lithium in the material relative to the maximum amount of lithium the material can accept, i.e., one Li in $LiFePO_4$, corresponds to the fractional state-of-charge, which when multiplied by 100 yields the state-of-charge.

When the free atoms, iron (Fe), phosphorous (P) and oxygen (O), in iron phosphate join, the individual electronic structures are modified to become part of the larger compound. The valence electrons of each atom contribute to bonding within the compound and charge transfer occurs among the atoms. The new electronic structure that is formed is characteristic of the specific compound and has a unique magnetic susceptibility associated with it. Further, modification of the electronic structure occurs when more ions are introduced to the compound, as would be the case with the insertion of lithium into the iron phosphate electrode during discharge of a lithium ion battery. This change has a measureable effect on the susceptibility of the electrode in proportion to the amount of lithium added. By systematically varying the fraction of lithium in the electrode and measuring the corresponding susceptibility X, it is possible to establish a relationship between the two variables.

Figure 2:
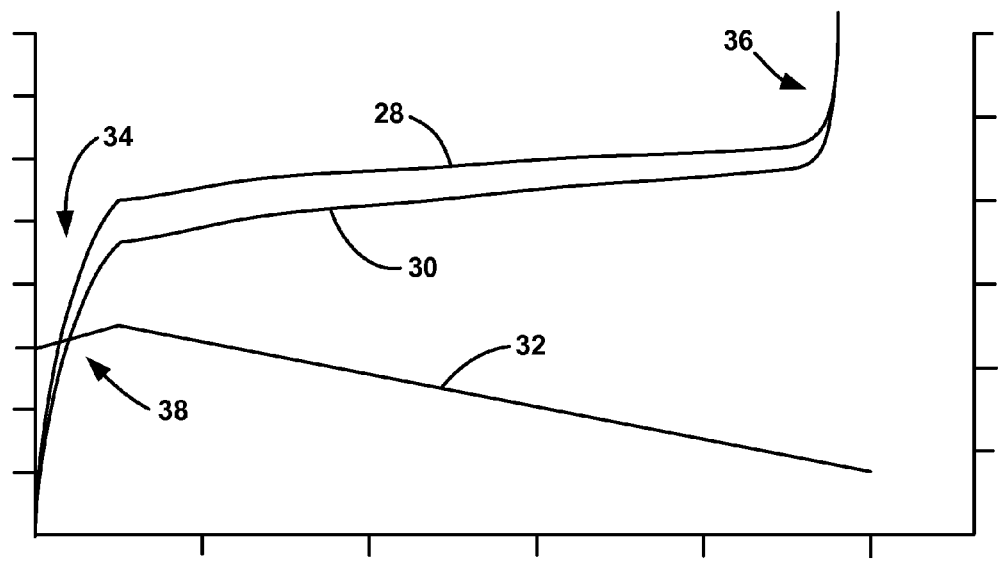
FIG. 2 is a graph with battery cell SOC on the horizontal axis, battery cell voltage on the right vertical axis and magnetic sensor response on the left vertical axis showing a relationship between battery cell open circuit voltage and battery cell SOC and between magnetic sensor response and battery cell SOC.

FIG. 2 is a graph with battery SOC on the horizontal axis, battery cell voltage on the right vertical axis and magnetic sensor response on the left vertical axis showing a representative depiction of the relationship between battery cell SOC and battery cell voltage and the relationship between magnetism of an iron phosphate lithium ion battery and battery cell SOC. Graph line 28 shows the relationship between battery cell SOC and cell voltage when the battery 12 is being charged and graph line 30 shows the relationship between battery cell SOC and cell voltage when the battery 12 is being discharged, where the relationship between the graph lines 28 and 30 provides a hysteresis output. As is apparent, the charge and discharge curves are significantly different and both are relatively flat across most of the SOC of the battery cell. Thus, as discussed above, it would be difficult to provide an accurate estimation of battery cell SOC based on battery open circuit voltage. Regions 34 and 36 define landmarks at the discharge and charge ends, respectively, of the lines 28 and 30 where the relationship between battery cell SOC and cell voltage is not flat, but has a significant slope, and can be used to accurately identify battery cell SOC.

For some battery technologies, such as $LiFePO_4$ lithium ion type, the measured equilibrium cell voltage is relatively invariant with state-of-charge and therefore provides little basis for a state-of-charge algorithm. As shown in FIG. 2, the equilibrium voltage is quite flat with respect to battery cell SOC, with the exception of the curve extremities at the regions 34 and 36, referred to herein as landmarks. In the regions 0-20%, 15-30%, 65-70% and 97-100% SOC, some dependence of voltage on SOC is noted, and in the regions 34 and 36 it is possible to implement an algorithm that derives SOC from an equilibrium voltage that is either measured at rest or estimated by calculation from a voltage under load. As discussed, the most distinct and easily-recognized voltage landmarks occur at 0 and 100% SOC. At either point, the battery cell SOC is known with certainty, and therefore may be used as a reference to calibrate the output of a magnetic sensor. When the cell equilibrium voltage indicates 0% SOC, the corresponding output of the magnetic sensor may also be assigned to 0% SOC. Likewise, when the cell equilibrium voltage indicates 100% SOC, the corresponding output of the magnetic sensor may also be assigned to 100% SOC. Other voltage landmarks may be used in a like manner, and may be determined either at equilibrium or under load. A current threshold may be assigned to a particular voltage in order to identify the point at which that voltage is qualified for use as a calibration point. Having calibrated the magnetic sensor, the change in its output relative to the point of calibration can then be used to determine SOC, rather than having to rely strictly on the absolute value of the output.

Returning to FIG. 2, graph line 32 shows the relationship between the magnetic properties of the iron phosphate in the battery cell and battery cell SOC. As is apparent, the relationship is linear, has a significant slope and is the same for battery charge and discharge. As the magnetic properties of some battery materials are known to depend on state-of-charge and have been shown to form the basis for a state-of-charge algorithm, any landmarks apparent in the relationship between those properties and battery SOC may be used to calibrate a sensor used to detect those properties. An example of a magnetic susceptibility landmark is shown in the graph line 32 at region 38, where a reversal of the trend in the magnetic sensor output is noted between 0 and 10% SOC due to a shift between diamagnetism and paramagnetism that occurs in the cell anode. This particular feature is characteristic of graphite anodes that are sparsely intercalated with lithium, but other landmarks may be found in other materials that maybe equally useful. The reversal of a trend, or a change in slope or sign of the sensor output such as this can, be used to calibrate the sensor output to a known SOC value, or to calibrate another SOC algorithm perhaps voltage or current based, operating in parallel with the magnetic sensor algorithm. The orientation of the sensor may be of importance to observe the desired property, as is the case for graphite anodes, where SOC-dependent paramagnetism is apparent only in a magnetic field oriented parallel to the c-axis of the unit cell. The position of the sensor may then be specified such that the magnetic field lines are perpendicular or parallel to the faces of the electrodes within the cell, or in any orientation that is suitable to observe the property.

Magnetic sensors have been proposed in the art to measure the magnetic properties of various of types of batteries and convert those magnetic responses to battery SOC. One known technique is discussed above in the '145 application publication. Because battery cells are typically closely packed together within a battery module or other housing, various designs may be required in the art to provide a suitable magnetic sensor for measuring the magnetic response of a battery cell for different battery designs. One general type design includes mounting a permanent magnetic to an end face of one of the end cells in a battery module and measuring a current induced by the permanent magnet field lines through the battery cell. However, other types of magnetic sensor designs may be more desirable for adequately measuring battery cell SOC.

Figure 3:
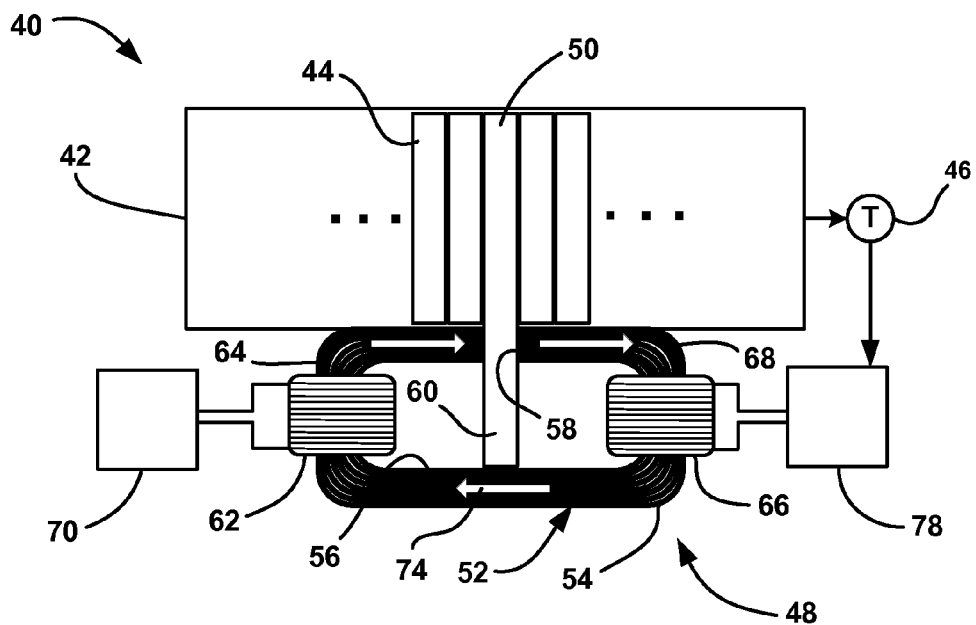
FIG. 3 is a schematic illustration of a magnetic sensor including a C-shaped core coupled to a battery cell in a battery module.

FIG. 3 is a schematic illustration of a battery module 40 including a housing 42 that encloses a plurality of battery cells 44, whose number may vary for different battery modules. In this embodiment, the battery cells 44 are iron phosphate lithium ion battery cells of the type being described herein, although other types of battery cells may be applicable to the invention. A magnetic sensor 48 is mounted to an outside surface of the housing 44 that measures the magnetic properties of one cell 50 of the plurality of cells 44. Although the magnetic sensor 48 is shown mounted to an outside surface of the housing 42, this is merely illustrative of one general configuration in that the magnetic sensor 44 can be mounted to any suitable location in or on the battery module 40. Also, the cell 50 is shown at the center of the plurality of cells 44. This is also by way of a non-limiting example in that the SOC of any of the cells 44 can be measured consistent with the discussion herein.

The magnetic sensor 48 includes a C-shaped core 52 comprised of a plurality of laminated layers 54 formed in the C-shape to define a central opening 56 and a transverse opening 58. The laminated layers 54 can be made of any suitable material, preferably a high magnetic permeability material, such as a mu metal. An extended portion 60 of the cell 50 extends out of the housing 42 through the transverse opening 58 and into the central opening 56, as shown. An AC driving coil 62 is wrapped around one end portion 64 of the core 52 and an AC receiving coil 66 is wrapped around an opposing end portion 68 of the core 52, as shown. An AC driving current is applied to the driving coil 62 by a current controller 70 to generate a magnetic field 74 within the core 52 that propagate across the transverse opening 58, and thus through the extended portion 60 of the cell 50.

The magnetic field 74 induces an AC current in the receiving coil 66 that is sent to a detection circuit 78 to measure the AC voltage resulting therefrom and convert it to an indicative magnetic field strength. Depending on the charge in the cell 50, the magnetism in the cell 50 will follow the graph line 32 in FIG. 2 for a constant temperature, where the higher the charge, the lower the magnetic attractive response. Thus, the magnetic field strength converted from the current flow in the receiving coil 66 can be converted to a battery cell SOC based on known magnetic properties of the cell material. Battery diagnostics are available and known in the art to determine whether the cell SOC of one battery cell is indicative of the cell SOC of the other cells 44 in the battery module 40. A temperature sensor 46 measures the temperature of the battery module 40 and provides a temperature signal to the detection circuit 78 to provide a temperature compensation because the magnetic properties of the cell 50 change with temperature, as will be discussed in more detail below.

The core 52 provides a concentration of the magnetic field 74 that increases the ability to detect changes in the battery cell SOC over those magnetic sensors known in the art for this purpose. Also, the sensor 48 is able to be placed inside of a vehicle because it is insensitive to vibration. Also, the magnetic field 74 is concentrated in the core 52 giving it a more consistent path that allows for more of the field 74 to be properly routed into the receiving coil 66. The sensor 48 does not measure the magnetic field directly, but the current or power created by the field 74.

Figure 4:
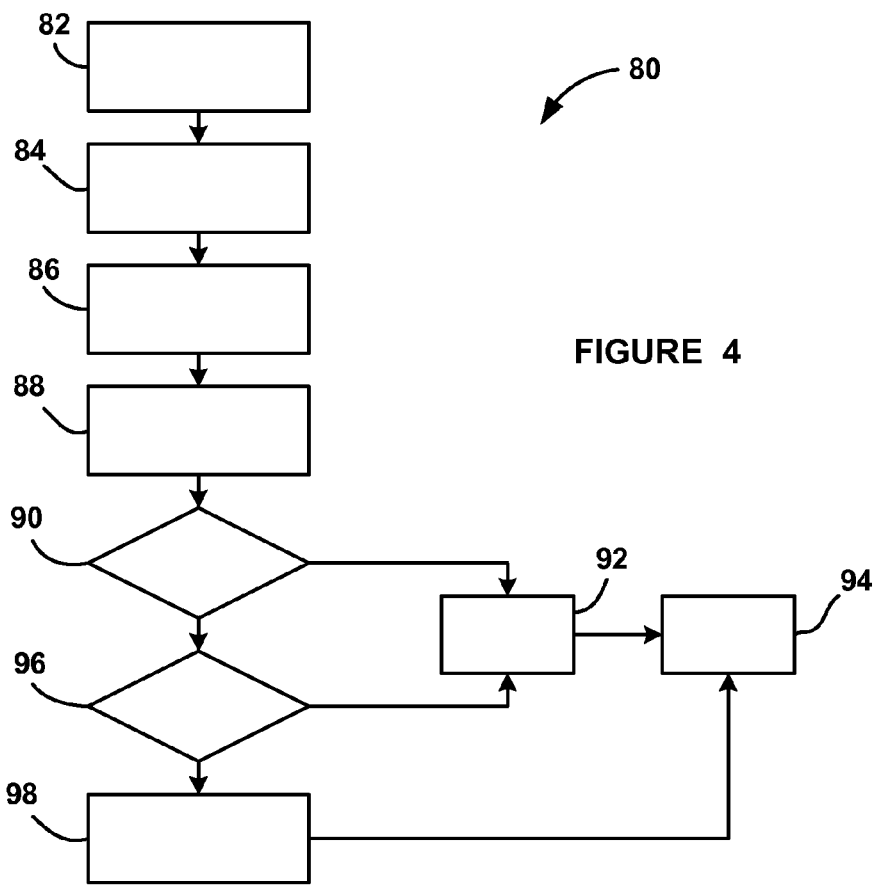
FIG. 4 is a flow chart diagram showing a process for converting a magnetic sensor current output signal to battery cell SOC.

FIG. 4 is a flow chart diagram 80 showing an exemplary process for converting the current output signal from the receiving coil 66 to a battery cell SOC in the detection circuit 78 based on the discussion above. Although the process discussed herein for converting the receiving coil current to a suitable battery cell SOC is for the magnetic sensor 48, it will be well understood by those skilled in the art that the process shown in the flow chart diagram 80 can be used for other magnetic sensors that are used for determining battery cell SOC.

The output signal from the receiving coil 60 is provided at box 82 and is corrected for an offset at box 84. The offset correction provides a calibration to ensure that the current output signal from the receiving coil 66 coincides with the known magnetic field 74 generated within the core 52. In order to correct drift in the sensor 48 that measures the magnetic field 74, it is desirable to periodically expose the sensor 48 to a magnetic field of known intensity. This is most easily accomplished by turning the AC drive signal off and removing the magnetic field 74 altogether, and observing the sensor output in the absence of the magnetic field 74. In other words, the driving coil 62 is turned off so that is does not generate the magnetic field 74 within the core 52 and the output current signal from the receiving coil 66 is set to zero. The current signal output of the sensor 48 can then be corrected to identify a null field, and any offset error in the current output signal from the receiving coil 60 is thus removed. In practice, if the magnetic field 74 is supplied by an electromagnet as it is in the case of this particular sensor, it can simply be switched off long enough to accomplish the offset correction. This exercise must be conducted with the environment of the sensor 48 in mind, and performed at times when no other incidental magnetic fields are present. In the context of a hybrid or electric vehicle application, this means that the vehicle would most likely be turned off. A field of known, but a non-zero magnetic intensity, may also be provided in order to accomplish the offset correction.

At box 86, the algorithm performs a temperature compensation for the offset corrected signal provided by the temperature sensor 46. Because the magnetic properties of materials are temperature dependent and the change in those properties with respect to temperature may be much larger than the change due to SOC differences, it is necessary to apply a temperature correction factor to the current output signal. Paramagnetic materials are subject to the Curie-Weiss Law, which states that their molar magnetic susceptibility Xm is inversely proportional to temperature as:

$$Xm = \frac{c}{(T-\theta)}, \qquad (3)$$

where C is the Curie constant, θ is the Weiss constant and T is the absolute temperature.

The sensitivity to temperature may be measured in a laboratory environment, recorded and stored in a look-up table in the detection circuit 78, and accessed to compensate the current output signal by the sensor control algorithm at any given time. Temperature should be measured as close to the magnetic sensor 48 as possible, and should be representative of the internal cell temperature at the location of the material of interest. The temperature signal may be simply sensed, or an algorithm may be used that estimates the cell internal temperature on the basis of a measured cell skin temperature. Additional temperature correction may be required for the magnetic sensor hardware itself, if any sensitivity to temperature exists.

At box 88, the algorithm performs a current compensation correction to correct for the magnetic field 74 induced in the core by sources other than the primary driving coil. Current flowing through a battery will induce magnetic fields in the vicinity of the electrical conductors inside a battery cell. Conductors outside of the cell, such as terminals and buss bars, will also induce magnetic fields. These fields will be sensed by the magnetic sensor 48 in addition to the magnetic field 74 applied for the purpose of sensing battery cell SOC. If measurements are to be made with the magnetic sensor 48 while current is flowing through the battery module 40, the current output signal must be compensated accordingly. In other words, the current flow in the receiving coil 66 that is generated by portions of the magnetic field 74 that are not generated by the battery cell whose state-of-charge is being measured needs to be removed or subtracted. As with the temperature correction, the effect of current flow through the sensor 48 is measured in the laboratory, recorded and stored in a look-up table in the detection circuit 78, and accessed to compensate the current output signal by the sensor control algorithm at any given time. Separate corrections may be applied for charge and discharge currents, or for different locations within a battery pack. The current offset correction may also be a function of temperature.

The compensated magnetic sensor signal that is ultimately passed through the look-up table conversion to yield battery cell state-of-charge is compensated for offset, temperature and current as:

$$\text{Compensated sensor signal} = S_{measured} - S_{offset} - S_{temp} - S_{current} \quad (4)$$

The algorithm then determines whether the battery cell voltage is at a landmark location in the battery/SOC curve at decision diamond 90. Particularly, if the cell voltage/SOC graph lines 30 and 32 are in the landmark region 34 or 36 in FIG. 2, where the graph lines 30 and 32 have a significant slope, then the cell voltage can be used to determine the battery cell SOC in a very accurate manner. If the cell voltage is in one of these regions at the decision diamond 90, the algorithm resets the battery cell SOC to the SOC for the corresponding voltage value at box 92, and outputs this battery cell SOC as the output value at box 94.

If the cell voltage is not at a voltage landmark at the decision diamond 90, then the algorithm determines whether the magnetic response indicates that it is at a magnetic landmark identified by the region 38 in FIG. 2, which can also be used to reset or calibrate the cell SOC at the box 96, in the manner as discussed above. If the cell voltage or magnetic response is not at any of the landmarks, then the corrected compensated output voltage from the receiving coil 66 is sent to a look-up at box 98 to convert that value to a battery cell SOC that is output at the box 94.

As will be well understood by those skilled in the art, the several and various steps and processes discussed herein to describe the invention may be referring to operations performed by a computer, a processor, or other electronic calculating device that manipulates and/or transforms data using electrical phenomenon. Those computers and electronic devices may employ various volatile and/or non-volatile memories including non-transitory computer-readable medium with an executable program stored thereon including various code or executable instructions able to be performed by the computer or processor, where the memory and/or computer-readable medium may include all forms and types of memory and other computer-readable media.

The foregoing discussion disclosed and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A method for determining a battery cell state-of-charge (SOC), said method comprising:
   applying an external magnetic field to a battery cell;
   measuring a magnetic field in the battery cell using a magnetic sensor;
   providing a current output signal from the magnetic sensor, where the current output signal corresponds to a measurement of the magnetic field in the battery cell;
   providing an offset correction to the current output signal that calibrates the current output signal to a known magnetic field strength, including removing the external magnetic field from the battery cell, determining a remaining magnetic field in the battery cell and using the remaining magnetic field as an offset correction;
   providing a temperature correction to the current output signal that corrects the current output signal based on a temperature of the magnetic sensor;
   providing a current correction to the current output signal that removes portions of the magnetic field caused by other battery cells, including identifying a current flow induced by other battery cells that adds to the magnetic field in the battery cell in a look-up table and using the look-up table to provide the current correction;
   calculating, using a controller including a processor and a memory, a corrected current output signal by adjusting the current output signal using the offset correction, the temperature correction and the current correction; and
   converting the corrected current output signal to the battery cell SOC of the battery cell using a known relationship between magnetic properties of the battery cell and the battery cell SOC.

2. The method according to claim 1 wherein converting the corrected current output signal to the battery cell SOC includes correcting the current output signal based on the equation:

$$\text{Compensated sensor signal} = S_{measured} - S_{offset} - S_{temp} - S_{current} \quad (4)$$

where $S_{measured}$ is the current output signal, $S_{offset}$ is the offset corrected current output signal, $S_{temp}$ is the temperature corrected current output signal and $S_{current}$ is the current corrected current output signal.

3. The method according to claim 1 further comprising determining whether a battery cell voltage of the battery cell is at a voltage landmark location identified in a graph line that defines a relationship between the battery cell voltage and the battery cell SOC, where the voltage landmark location has a slope in the graph line that is greater than a predetermined slope, and if the battery cell voltage is at a voltage landmark location, using the battery cell voltage to determine the battery cell SOC instead of the corrected current output signal.

4. The method according to claim 3 wherein the voltage landmark locations in the graph line occur at a battery cell SOC below 10% SOC and a battery cell SOC above 90% SOC.

5. The method according to claim 1 further comprising determining whether the magnetic field is at a magnetic landmark location identified in a graph line that defines a relationship between the magnetic field and the battery cell SOC, where the magnetic landmark location has a change in slope magnitude or direction relative to the rest of the graph line, and if the magnetic field is at a magnetic landmark location, using the magnetic field to determine the battery cell SOC instead of the current output signal from the magnetic sensor.

6. The method according to claim 1 wherein providing a temperature correction to the current output signal includes providing a sensitivity to temperature relationship of materials in the battery cell in a look-up table and then using the look-up table to provide the temperature correction based on a determined temperature.

7. The method according to claim 6 wherein the temperature is determined by a temperature sensor.

8. The method according to claim 6 wherein the temperature is determined by a temperature estimation algorithm.

9. The method according to claim 1 wherein the battery cell is an iron phosphate lithium ion battery cell.

10. The method according to claim 9 wherein the battery cell is part of a battery module including a plurality of battery cells on an electric vehicle.

11. A method for determining a battery cell state-of-charge (SOC), said battery cell being one of a plurality of battery cells in a battery module on a vehicle, said method comprising:
applying an external magnetic field to the battery cell;
measuring a magnetic field in the battery cell using a magnetic sensor;
providing a current output signal from the magnetic sensor, where the current output signal corresponds to a measurement of the magnetic field in the battery cell;
providing an offset correction to the current output signal that calibrates the current output signal to a known magnetic field strength, including removing the external magnetic field from the battery cell, determining a remaining magnetic field in the battery cell and using the remaining magnetic field as an offset correction;
providing a temperature correction to the current output signal that corrects the current output signal based on a temperature of the magnetic sensor;
providing a current correction to the current output signal that removes portions of the magnetic field caused by the other battery cells or electrically conductive components within the battery module, including identifying a current flow induced by other battery cells that adds to the magnetic field in the battery cell in a look-up table and using the look-up table to provide the current correction;
calculating, using a controller including a processor and a memory, a corrected current output signal by adjusting the current output signal using the offset correction, the temperature correction and the current correction;
converting the corrected current output signal to the battery cell SOC of the battery cell using a known relationship between magnetic properties of the battery cell and the battery cell SOC;
determining whether a battery cell voltage of the battery cell is at a voltage landmark location identified in a graph line that defines a relationship between the battery cell voltage and the battery cell SOC, where the voltage landmark location has a slope in the graph line that is greater than a predetermined slope;
using the battery cell voltage to determine the battery cell SOC instead of the corrected current output signal if the battery cell voltage is at the voltage landmark location;
determining whether the magnetic field is at a magnetic landmark location identified in a graph line that defines a relationship between the magnetic field of the battery cell and the battery cell SOC, where the magnetic landmark location has a change in slope magnitude or direction relative to the rest of the graph line; and
using the magnetic field to determine the battery cell SOC instead of the corrected current output signal if the magnetic field is at the magnetic landmark location.

12. The method according to claim 11 wherein the voltage landmark locations in the graph line occur at a battery cell SOC below 10% SOC and a battery cell SOC above 90% SOC.

13. The method according to claim 11 wherein providing a temperature correction to the current output signal includes providing a sensitivity to temperature relationship of materials in the battery cell in a look-up table and then using the look-up table to provide the temperature correction based on a determined temperature.

14. The method according to claim 11 wherein the battery cell is an iron phosphate lithium ion battery cell.

15. A system for determining a battery cell state-of-charge (SOC), said system comprising:
means for applying an external magnetic field to a battery cell;
a magnetic sensor for measuring a magnetic field in the battery cell;
means for providing a current output signal from the magnetic sensor, where the current output signal corresponds to a measurement of the magnetic field in the battery cell;
means for providing an offset correction to the current output signal that calibrates the current output signal to a known magnetic field strength, including removing the external magnetic field from the battery cell, determining a remaining magnetic field in the battery cell and using the remaining magnetic field as an offset correction;
means for providing a temperature correction to the current output signal that corrects the current output signal based on a temperature of the magnetic sensor;
means for providing a current correction to the current output signal that removes portions of the magnetic field caused by other battery cells, including identifying a current flow induced by other battery cells that adds to the magnetic field in the battery cell in a look-up table and using the look-up table to provide the current correction;
a processor for calculating a corrected current output signal by adjusting the current output signal using the offset correction, the temperature correction and the current correction; and
converting the corrected current output signal to the battery cell SOC using a known relationship between magnetic properties of the battery cell and the battery cell SOC.

16. The system according to claim 15 further comprising means for determining whether a battery cell voltage of the battery cell is at a voltage landmark location identified in a graph line that defines a relationship between the battery cell voltage and the battery cell SOC, where the voltage landmark location has a slope in the graph line that is greater than a predetermined slope, and if the battery cell voltage is at a voltage landmark location, using the battery cell voltage to determine the battery cell SOC instead of the corrected current output signal.

* * * * *